(12) United States Patent
Tanaka et al.

(10) Patent No.: US 12,119,421 B2
(45) Date of Patent: Oct. 15, 2024

(54) PHOTODETECTOR

(71) Applicant: SONY SEMICONDUCTOR SOLUTIONS CORPORATION, Kanagawa (JP)

(72) Inventors: Katsuhisa Tanaka, Kanagawa (JP); Yusuke Otake, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 249 days.

(21) Appl. No.: 17/784,276

(22) PCT Filed: Dec. 18, 2020

(86) PCT No.: PCT/JP2020/047360
§ 371 (c)(1),
(2) Date: Jun. 10, 2022

(87) PCT Pub. No.: WO2021/132056
PCT Pub. Date: Jul. 1, 2021

(65) Prior Publication Data
US 2023/0040457 A1 Feb. 9, 2023

(30) Foreign Application Priority Data
Dec. 25, 2019 (JP) .................................. 2019-233854

(51) Int. Cl.
*H01L 31/107* (2006.01)
*H01L 31/0224* (2006.01)
(52) U.S. Cl.
CPC .... *H01L 31/107* (2013.01); *H01L 31/022408* (2013.01)

(58) Field of Classification Search
CPC .............................................. H01L 31/022408
See application file for complete search history.

(56) References Cited

U.S. PATENT DOCUMENTS 8,405,180 B2 * 3/2013 Akiyama .......... H01L 27/14643
257/E31.127
2013/0200479 A1 8/2013 Sakano
(Continued)

FOREIGN PATENT DOCUMENTS

JP 2014-146820 8/2014
JP 2019-033136 2/2019
(Continued)

OTHER PUBLICATIONS

International Search Report and Written Opinion prepared by the Japan Patent Office on Mar. 12, 2021, for International Application No. PCT/JP2020/047360, 2 pgs.

*Primary Examiner* — Suberr L Chi
(74) *Attorney, Agent, or Firm* — Sheridan Ross PC

(57) ABSTRACT

A photodetector including: an amplification region that includes a PN junction provided in a depth direction in a semiconductor layer and that is to be electrically coupled to a cathode; a separation region that defines a pixel region including the amplification region; a hole accumulation region that is provided along a side surface of the separation region and that is to be electrically coupled to an anode; and a gate electrode provided in a region between the amplification region and the hole accumulation region and stacked over the semiconductor layer with a gate insulating film interposed therebetween.

14 Claims, 12 Drawing Sheets

(56) References Cited

U.S. PATENT DOCUMENTS

2019/0035854 A1 1/2019 Yamaguchi
2019/0181177 A1 6/2019 Kobayashi et al.

FOREIGN PATENT DOCUMENTS

| JP | 2019-140132 | 8/2019 |
| WO | WO 2018/074530 | 4/2018 |

* cited by examiner

PHOTODETECTOR

CROSS REFERENCE TO RELATED APPLICATIONS

This application is a national stage application under 35 U.S.C. 371 and claims the benefit of PCT Application No. PCT/JP2020/047360, having an international filing date of 18 Dec. 2020, which designated the United States, which PCT application claimed the benefit of Japanese Patent Application No. 2019-233854, filed 25 Dec. 2019, the entire disclosures of each of which are incorporated herein by reference.

TECHNICAL FIELD

The present disclosure relates to a photodetector.

BACKGROUND ART

Recently, a single photon avalanche diode (Single Photon Avalanche Diode: SPAD) which is an avalanche photodiode to be operated with a bias voltage higher than a breakdown voltage has been proposed (see PTL 1, for example).

The SPAD allows carriers generated by photoelectric conversion to be multiplied in a high-electric-field PN junction region provided for each pixel. A photodetector using the SPAD is thus drawing attention as a device that is able to detect a single photon for each pixel.

CITATION LIST

Patent Literature

PTL 1: International Publication No. WO2018/074530

SUMMARY OF THE INVENTION

For a photodetector using an SPAD, it is desired to further enhance a detection sensitivity to light by further enhancing photon detection efficiency (Photon Detection Efficiency: PDE) of the SPAD.

It is desirable to provide a photodetector that achieves a further enhanced detection sensitivity to light.

A photodetector according to an embodiment of the present disclosure includes: an amplification region that includes a PN junction provided in a depth direction in a semiconductor layer and that is to be electrically coupled to a cathode; a separation region that defines a pixel region including the amplification region; a hole accumulation region that is provided along a side surface of the separation region and that is to be electrically coupled to an anode; and a gate electrode provided in a region between the amplification region and the hole accumulation region and stacked over the semiconductor layer with a gate insulating film interposed therebetween.

According to the photodetector of the embodiment of the present disclosure, there are provided the amplification region that includes the PN junction provided in the depth direction in the semiconductor layer, the separation region that defines the pixel region including the amplification region, the hole accumulation region provided along the side surface of the separation region, and the gate electrode stacked over the semiconductor layer in the region between the amplification region and the hole accumulation region. This makes it possible for the photodetector to, for example, cause entering light that is passing through the semiconductor layer to be reflected by the gate electrode back to the semiconductor layer.

MODES FOR CARRYING OUT THE INVENTION

Figure 1:
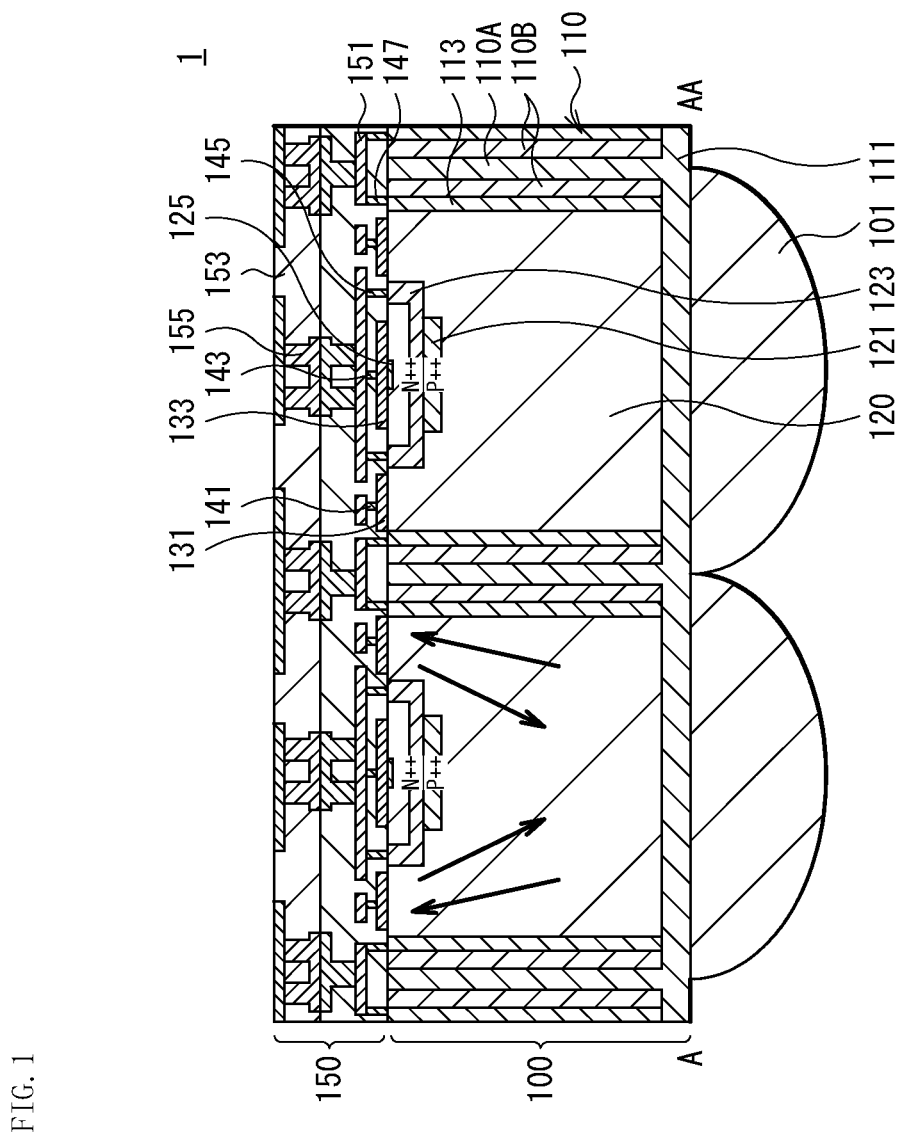
FIG. 1 is a vertical cross-sectional diagram illustrating an example of a cross-sectional configuration of a photodetector according to an embodiment of the present disclosure.

In the following, description is given in detail of embodiments of the present disclosure with reference to the drawings. The embodiments described in the following are specific examples of the present disclosure, and the technology according to the present disclosure is not limited to the following modes. In addition, arrangements, dimensions, dimensional ratios, and the like of components in the present disclosure are not limited to the modes illustrated in the drawings.

It is to be noted that the description is given in the following order.

1. Embodiment
   1.1. Configuration Example
   1.2. Operation Example
   1.3. Modification Examples

2. Application Examples

1. Embodiment

1.1. Configuration Example

Figure 2:
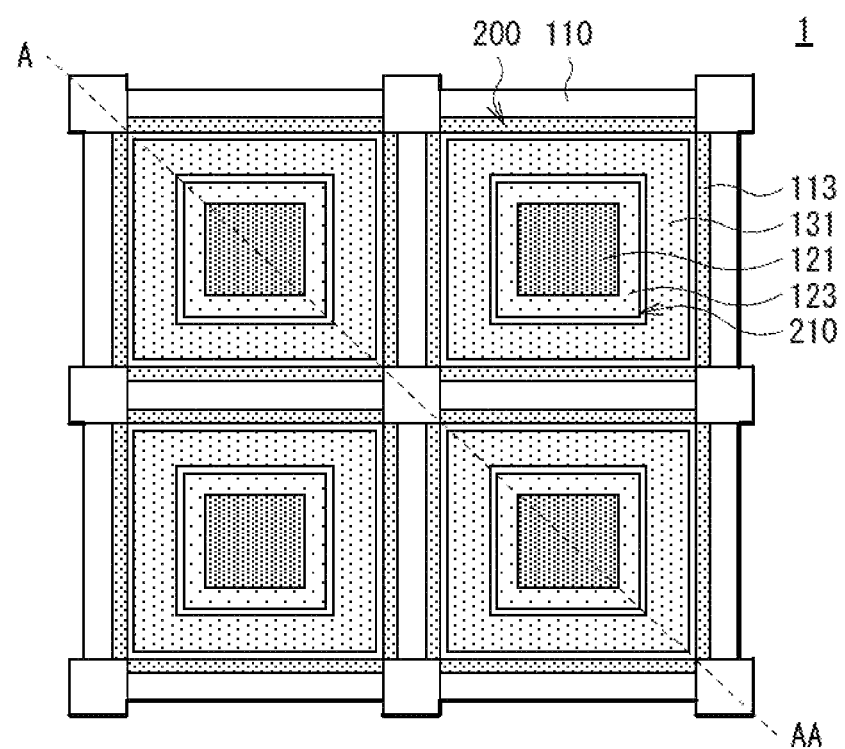
FIG. 2 is a plan diagram illustrating an example of a plan configuration of the photodetector according to the embodiment.

First, with reference to FIGS. 1 and 2, description is given of a configuration example of a photodetector according to an embodiment of the present disclosure. FIG. 1 is a vertical cross-sectional diagram illustrating an example of a cross-sectional configuration of a photodetector 1 according to the present embodiment. FIG. 2 is a plan diagram illustrating an example of a plan configuration of the photodetector 1 according to the present embodiment.

First, with reference to FIG. 1, description is given of the cross-sectional configuration of the photodetector 1 according to the present embodiment. The cross-sectional configuration of the photodetector 1 illustrated in FIG. 1 corresponds to a cross-sectional configuration taken along a cutting line A-AA in the plan configuration of the photodetector 1 illustrated in FIG. 2.

As illustrated in FIG. 1, the photodetector 1 includes, for example, a semiconductor layer 100 including an SPAD (Single Photon Avalanche Diode), a multilayer wiring layer 150, a pixel-defining film 111, and an on-chip lens 101. It is to be noted that in the present specification, a side on which the multilayer wiring layer 150 is provided is also referred to as a front surface side, and a side on which the on-chip lens 101 is provided is also referred to as a back surface side.

The semiconductor layer 100 includes a semiconductor such as Si (silicon), for example. The semiconductor layer 100 includes, for example, a well layer 120, a P++-type region 121, an N++-type region 123, a P-type region 125, a separation region 110, and a hole accumulation region 113. The well layer 120, the P++-type region 121, and the N++-type region 123 configure a so-called SPAD.

The well layer 120 is, for example, a semiconductor region having a P-type or N-type electrical conductivity. Specifically, the well layer 120 may be a P-type or N-type semiconductor region having an impurity concentration lower than that of each of the P++-type region 121 and the N++-type region 123. Providing the well layer 120 as a P-type or N-type semiconductor region having a low concentration makes it easier for the well layer 120 to be depleted, thus making it possible to further enhance photon detection efficiency (Photon Detection Efficiency: PDE) of the SPAD.

The P++-type region 121 is, for example, a semiconductor region having a P-type electrical conductivity and having a high impurity concentration. The P++-type region 121 is provided inside the well layer 120 deeper than the N++-type region 123, and forms a PN junction at an interface with the N++-type region 123. Further, the P++-type region 121 includes a multiplier region that performs avalanche multiplication of carriers generated by light that enters the well layer 120 through the on-chip lens 101. By being depleted, the P++-type region 121 makes it possible to further enhance the PDE of the SPAD.

The N++-type region 123 is, for example, a semiconductor region having an N-type electrical conductivity and having a high impurity concentration. The N++-type region 123 is provided on the front surface side of the well layer 120 relative to the P++-type region 121. Further, the N++-type region 123 has a projection part that projects toward the front surface side of the well layer 120 and that is provided at an end of an outer edge continuously all around the N++-type region 123. At the projection part, the N++-type region 123 is electrically coupled to a contact 145 provided in the multilayer wiring layer 150. The N++-type region 123 is thereby able to function as a cathode of the SPAD.

In a middle part of the N++-type region 123, the P-type region 125 is provided to be further on the front surface side of the well layer 120 relative to the N++-type region 123. The P-type region 125 is a P-type semiconductor region, and is provided to have a different potential from that of an anode described later. Specifically, the P-type region 125 may be provided to have the same potential as that of a ground (GND) or the cathode. This makes it possible for the P-type region 125 to function as a region in which holes are accumulated. By accumulating holes, the P-type region 125 is able to reduce an inflow of a dark current generated on the front surface of the well layer 120 and damage at the time of formation of the N++-type region 123. Therefore, the P-type region 125 is able to reduce a generation rate of dark electrons, and is thus able to further suppress background noise of the SAPD.

The separation region 110 is provided through the well layer 120, and separates the well layer 120 for each pixel. Specifically, the separation region 110 is provided in a grid-like plan shape to thereby separate the well layer 120 into a plurality of pixel regions arranged in a matrix on a plane. It is to be noted that the separation region 110 may be provided to penetrate entirely through the well layer 120 from the front surface to the back surface as illustrated in FIG. 1, or may be provided to penetrate partway through the well layer 120 from the front surface to some middle point.

The separation region 110 may include a metal layer 110A, and an insulating layer 110B that is provided on a side surface of the metal layer 110A. The metal layer 110A includes, for example, W (tungsten) or the like. The metal layer 110A reflects stray light entering from an adjacent pixel, thus being able to further reduce a crosstalk between adjacent pixels. The insulating layer 110B includes an insulating material such as $SiO_2$ (silicon dioxide) and is provided on the side surface of the metal layer 110A, for example. The insulating layer 110B is provided for electrically insulating the metal layer 110A and the well layer 120 from each other.

The hole accumulation region 113 is provided along a side surface of the separation region 110. The hole accumulation region 113 is, for example, a semiconductor region having a P-type electrical conductivity, and is provided as a region in which holes are accumulated. The hole accumulation region 113 is provided at an interface at which different materials are in contact with each other, and is able to suppress the occurrence of a dark current by absorbing electrons generated at the interface. Further, by being provided on the side surface of the separation region 110, the hole accumulation region 113 forms an electric field in an in-plane direction in the semiconductor layer 100, allowing for easier collection of carriers into the multiplier region of the P++-type region 121. The hole accumulation region 113 is thereby able to further enhance the PDE of the SPAD.

Further, the hole accumulation region 113 is electrically coupled to a contact 147 provided in the multilayer wiring layer 150 on the front surface side of the well layer 120. The hole accumulation region 113 on the front surface side of the well layer 120 is thereby able to function as an anode of the SPAD.

The multilayer wiring layer 150 includes a wiring line electrically coupled to the cathode, the anode, and the like of the SPAD provided in the semiconductor layer 100, and is stacked on the front surface side of the semiconductor layer 100. The multilayer wiring layer 150 includes, for example, a gate electrode 131, a P-type region electrode 133, contacts 141, 143, 145, and 147, a wiring layer 151, an interlayer insulating layer 153, and a junction part 155.

The gate electrode 131 is provided over the well layer 120 in a region between the hole accumulation region 113 and the N++-type region 123 with a gate insulating film (not illustrated) interposed therebetween. For example, the gate electrode 131 may include a metal such as W (tungsten), Cu (copper), or Al (aluminum), or polysilicon, and be provided on the gate insulating film. The unillustrated gate insulating film may include $SiO_2$ (silicon dioxide) and be provided on the well layer 120.

Here, with reference to FIG. 2, a plan arrangement of the gate electrode 131 is described more specifically.

As illustrated in FIG. 2, in the photodetector 1, the separation region 110 is provided in a grid shape, and the pixel regions 200 are provided in rectangular regions that are spaced from each other in a matrix by the separation region 110. The pixel regions 200 each include the hole accumulation region 113, the gate electrode 131, the P++-type region 121, and the N++-type region 123 to constitute one pixel in a pixel array of the photodetector 1.

The hole accumulation region 113 is provided along an inner side of the separation region 110. The P++-type region 121 is provided in a rectangular shape in a middle part of the pixel region 200. The N++-type region 123 is so provided in a rectangular shape in the middle part of the pixel region 200 as to include a region in which the P++-type region 121 is provided. A region in which the N++-type region 123 is provided is a region pertinent to amplification of carriers by avalanche multiplication in the pixel region 200, and is also referred to as an amplification region 210.

The gate electrode 131 is provided in a region between the hole accumulation region 113 and the amplification region 210. Specifically, the gate electrode 131 is provided in an annular shape to surround the periphery of the amplification region 210 (i.e., the N++-type region 123) provided in a rectangular shape.

The gate electrode 131 has a light-reflecting property, and is therefore able to reflect light that is making an entry into the multilayer wiring layer 150 from between the hole accumulation region 113 and the N++-type region 123. The gate electrode 131 is thereby able to cause light that has passed though the well layer 120 and is making an entry into the multilayer wiring layer 150 without contributing to carrier generation to be reflected back to the well layer 120 side, thus making it possible to increase the amount of electric charge generated in the P++-type region 121 and the N++-type region 123. Therefore, the gate electrode 131 is able to improve the PDE (Photon Detection Efficiency) of the SPAD.

It is to be noted that in order to reflect more light passing through the well layer 120, the gate electrode 131 is preferably provided to extend over an entire region between the hole accumulation region 113 and the amplification region 210.

Further, the gate electrode 131 is provided to allow a negative bias voltage to be applied thereto via the contact 141. With the negative bias voltage applied thereto, the gate electrode 131 is able to provide the well layer 120 below the gate electrode 131 with a potential gradient. The gate electrode 131 thus makes it possible to attract carriers to the gate electrode 131 side by means of the potential gradient, and to thereby discharge the carriers to the outside of the well layer 120. Therefore, the gate electrode 131 is able to prevent carriers generated in the well layer 120 from remaining inside the well layer 120 and becoming a noise source.

The P-type region electrode 133 is provided on the P-type region 125. Specifically, the P-type region electrode 133 is so provided on the well layer 120 inside a region surrounded by the projection part of the N++-type region 123 as not to be in contact with the projection part of the N++-type region 123. The P-type region electrode 133 applies the same potential as the potential of the ground (GND) or the cathode to the P-type region 125.

The contacts 141, 143, 145, and 147 electrically couple each of the electrodes provided on the well layer 120 and each of the cathode and the anode provided in the well layer 120 to the wiring layer 151. Specifically, the contact 141 electrically couples the gate electrode 131 and the wiring layer 151 to each other, and the contact 143 electrically couples the P-type region electrode 133 and the wiring layer 151 to each other. The contact 145 electrically couples the N++-type region 123 functioning as the cathode of the SPAD and the wiring layer 151 to each other, and the contact 147 electrically couples the front surface side of the hole accumulation region 113 functioning as the anode of the SPAD and the wiring layer 151 to each other. The contacts 141, 143, 145, and 147 may be provided as a single-layer structure or a multilayer structure of any of metals, including Ti (titanium), Ta (tantalum), and W (tungsten), or a compound of any of these metals.

The wiring layer 151 includes a metal material such as Cu (copper) or aluminum (Al), and is provided inside the multilayer wiring layer 150. Specifically, the wiring layer 151 includes a plurality of layers stacked with the interlayer insulating layer 153 interposed between the layers, the layers being electrically coupled to each other by a contact penetrating through the interlayer insulating layer 153. The wiring layer 151 electrically couples each of the electrodes provided on the well layer 120 and each of the cathode and the anode provided in the well layer 120 to a predetermined circuit.

The interlayer insulating layer 153 includes an insulating material such as $SiO_2$ (silicon dioxide) or SiN (silicon nitride), and is provided to embed the wiring layer 151 therein. The interlayer insulating layer 153 forms a layer structure of the multilayer wiring layer 150 and electrically insulates the wiring layers 151 provided inside the multilayer wiring layer 150 from each other.

The junction part 155 is provided, for example, to form an electrical coupling point between substrates in a case where the substrates are bonded to each other to form the photodetector 1. Specifically, the junction part 155 is provided by bringing electrodes provided to be exposed at front surfaces of the substrates into contact with each other and thereafter joining the electrodes by heat treatment or the like. By using the junction part 155, it becomes possible for the photodetector 1 to be formed by, for example, bonding a semiconductor substrate provided with an SPAD and a semiconductor substrate provided with a signal processing circuit to each other. This makes it possible to reduce the degree of difficulty of a manufacturing process of the photodetector 1. It is to be noted that depending on the manufacturing process of the photodetector 1, no junction part 155 may be provided.

The pixel-defining film 111 is provided on a surface of the separation region 110 on a side opposite to the side on which the multilayer wiring layer 150 is stacked (i.e., the back surface side). The pixel-defining film 111 is also referred to as a black matrix, and is provided around the pixels to thereby prevent light from entering the separation region 110 between the pixels. The pixel-defining film 111 may include, for example, W (tungsten) or the like.

It is to be noted that the pixel-defining film 111 illustrated between the well layer 120 and the on-chip lens 101 in FIG. 1 is the pixel-defining film 111 provided on the back surface side of the separation region 110 on a front side or a rear side of the well layer 120 relative to the plane of the sheet. In actuality, no pixel-defining film 111 is provided between the well layer 120 inside the pixel region surrounded by the separation region 110 and the on-chip lens 101.

The on-chip lens 101 is provided, for example, on the back surface side of the semiconductor layer 100 for each pixel. The on-chip lens 101 includes a transparent optical material, and condenses light entering the well layer 120.

With the photodetector 1 having the configuration described above, it is possible for light that passes through the well layer 120 without contributing to generation of carriers to be reflected by the gate electrode 131 to the well layer 120 side. Therefore, the photodetector 1 is able to improve a carrier generation amount in the well layer 120 and improve the PDE of the SPAD. Accordingly, the photodetector 1 is able to further improve the detection sensitivity to light.

1.2. Operation Example

Figure 3:
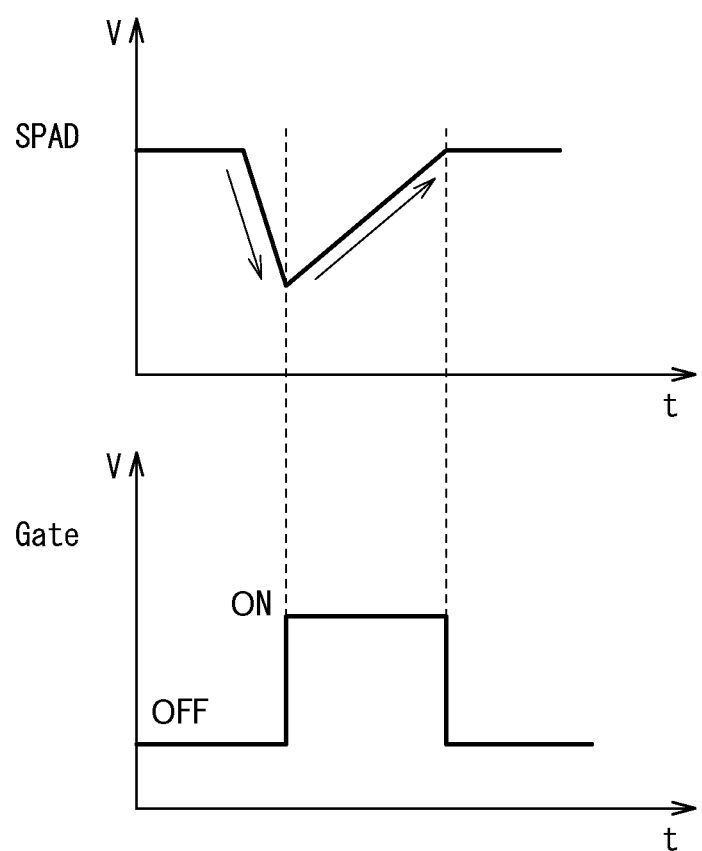
FIG. 3 is a graph diagram schematically illustrating transitions of an SPAD output and an applied voltage to a gate electrode in the photodetector according to the embodiment.
Figure 4:
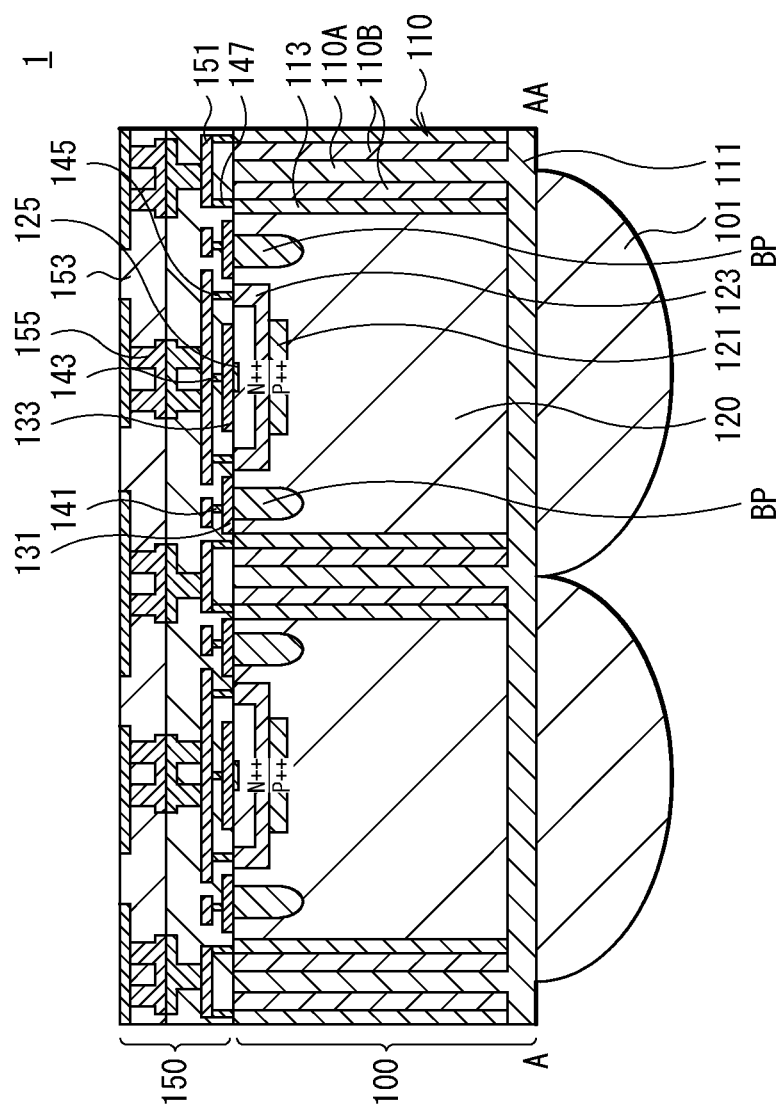
FIG. 4 is a vertical cross-sectional diagram schematically illustrating a potential gradient resulting from the gate electrode with application of a negative bias voltage thereto.

Next, with reference to FIGS. 3 and 4, description is given of an operation example of the photodetector 1 according to the present embodiment. FIG. 3 is a graph diagram schematically illustrating transitions of an SPAD output and an applied voltage to the gate electrode 131 in the photodetector 1 according to the present embodiment. FIG. 4 is a vertical cross-sectional diagram schematically illustrating a potential gradient resulting from the gate electrode 131 with a negative bias voltage applied thereto.

In the SPAD included in the photodetector 1 according to the present embodiment, a voltage higher than a breakdown voltage is applied to between the anode (the front surface side of the hole accumulation region 113) and the cathode (the N++-type region 123). As a result, in the SPAD, an intense electric field is applied to the N++-type region 123 and the multiplier region of the P++-type region 121, and carriers generated by photoelectric conversion of entering light are avalanche-multiplied in the multiplier region. Accordingly, the photodetector 1 is able to obtain an amplified photodetection signal.

It is possible to stop the avalanche multiplication by controlling the voltage between the anode and the cathode to be lower than the breakdown voltage via a resistor or the like. For example, the photodetector 1 is able to cause a voltage drop by flowing a current generated by avalanche multiplication of the carriers from the cathode to the resistor, and to thereby reduce a cathode potential to less than the breakdown voltage. The photodetector 1 is thereby able to stop the avalanche multiplication after entry of light. Such an operation of the photodetector 1 is also referred to as a quench operation. Thereafter, the photodetector 1 resets the voltage between the anode and the cathode to a voltage higher than the breakdown voltage to allow for detection of new light.

Here, noise that is specific to the SPAD and called after-pulse can occur in the photodetector 1. The after-pulse is a phenomenon in which after a signal based on light having entered the photodetector 1 is detected, a signal is detected again in spite of entry of no new light. Causes of the after-pulse include, for example, carriers generated in a large amount by the avalanche multiplication still remaining in the well layer 120 or the like even after the quench operation. The carriers that remain cause avalanche multiplication to occur when a voltage higher than the breakdown voltage is applied between the anode and the cathode in order to detect new light, and therefore a current resulting from the avalanche multiplication is considered to be detected as the after-pulse.

In the photodetector 1 according to the present embodiment, as illustrated in FIG. 3, a negative bias voltage is applied to the gate electrode 131 upon a drop in voltage resulting from the quench operation in the SPAD. The application of the negative bias voltage to the gate electrode 131 is performed until, for example, the current resulting from the avalanche multiplication decreases to eliminate the voltage drop caused by the resistor and the cathode potential returns to a potential at a level before detection of the light.

As illustrated in FIG. 4, as a result of the application of the negative bias voltage, a potential gradient BP due to the negative bias voltage applied to the gate electrode 131 is generated in the well layer 120 below the gate electrode 131. The gate electrode 131 is able to attract carriers remaining in the well layer 120 to the gate electrode 131 side by means of the potential gradient BP, thus making it possible to discharge the attracted carriers to the outside of the well layer 120. This makes it possible for the photodetector 1 to apply a voltage to between the anode and the cathode in order to detect new light in a state where no carriers remain in the well layer 120, thus making it possible to suppress the occurrence of the after-noise. In other words, the photodetector 1 is able to suppress the occurrence of noise by applying, after the quench operation, the negative bias voltage to the gate electrode 131 provided in the region between the hole accumulation region 113 and the N++-type region 123.

1.3. Modification Examples

First Modification Example

Figure 5:
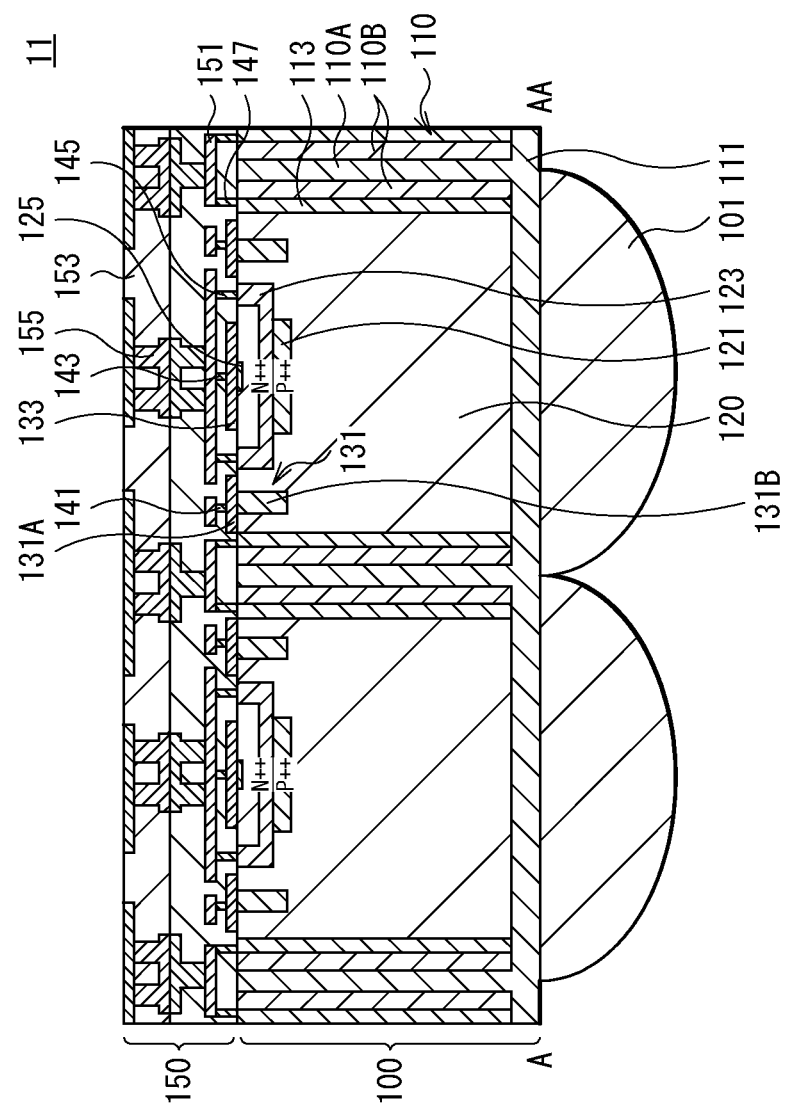
FIG. 5 is a vertical cross-sectional diagram illustrating an example of a cross-sectional configuration of a photodetector according to a first modification example.

Next, with reference to FIG. 5, description is given of a configuration example of a photodetector according to a first modification example. FIG. 5 is a vertical cross-sectional diagram illustrating an example of a cross-sectional configuration of the photodetector 11 according to the first modification example.

As illustrated in FIG. 5, the photodetector 11 according to the first modification example is different from the photodetector 1 illustrated in FIGS. 1 and 2 in three-dimensional shape of the gate electrode 131. The other configurations of the photodetector 11 according to the first modification example are similar to those of the photodetector 1 illustrated in FIGS. 1 and 2, and descriptions thereof are therefore omitted here.

In the photodetector 11 according to the first modification example, the gate electrode 131 includes a flat part 131A and an embedded part 131B. The gate electrode 131 may include a metal such as W (tungsten), Cu (copper), or Al (aluminum), or polysilicon. It is to be noted that an unillustrated gate insulating film is provided between the flat part 131A and the embedded part 131B of the gate electrode 131 and the well layer 120.

The flat part 131A is provided on the front surface of the well layer 120 between the hole accumulation region 113 and the N++-type region 123. The flat part 131A is provided to reflect light that passes through the well layer 120 and makes an entry into the multilayer wiring layer 150. Therefore, the flat part 131A may be provided to extend over an entire region between the hole accumulation region 113 and the N++-type region 123.

The embedded part 131B is provided to extend in a depth direction in the well layer 120 and to be embedded inside the well layer 120. The embedded part 131B is provided to cause the potential gradient created upon application of the negative bias voltage to the gate electrode 131 to extend to a deeper region in the well layer 120. This makes it possible for the embedded part 131B to discharge carriers remaining in a deeper portion of the well layer 120.

Therefore, owing to the gate electrode 131 including the flat part 131A and the embedded part 131B, the photodetector 11 according to the first modification example makes it possible to more effectively discharge carriers that remain to become a cause of the after-noise. The photodetector 11 according to the first modification example therefore makes it possible to further suppress the occurrence of noise.

Second Modification Example

Figure 6:
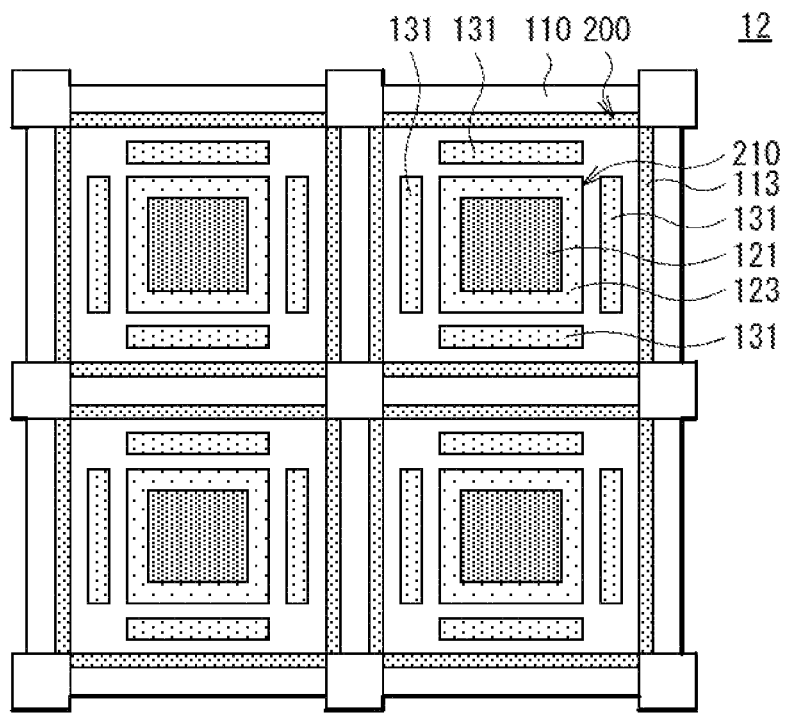
FIG. 6 is a plan diagram illustrating an example of a plan configuration of a photodetector according to a second modification example.

Next, with reference to FIG. 6, description is given of a configuration example of a photodetector according to a second modification example. FIG. 6 is a plan diagram illustrating an example of a plan configuration of the photodetector 12 according to the second modification example.

As illustrated in FIG. 6, the photodetector 12 according to the second modification example is different from the photodetector 1 illustrated in FIGS. 1 and 2 in plan arrangement of the gate electrode 131. The other configurations of the photodetector 12 according to the second modification example are similar to those of the photodetector 1 illustrated in FIGS. 1 and 2, and descriptions thereof are therefore omitted here.

In the photodetector 12 according to the second modification example, the gate electrodes 131 are provided to be spaced from each other in regions that are each between corresponding one of side parts of the amplification region 210 (i.e., the N++-type region 123) provided in a rectangular shape and the hole accumulation region 113. For example, the gate electrodes 131 may be provided on four respective sides above, below, to the left, and to the right of the amplification region 210, in the shape of rectangles spaced from each other.

Thus, owing to the provision of the gate electrodes 131 in the above-described regions, the photodetector 12 according to the second modification example makes it possible to improve controllability of the potential gradient created upon application of the negative bias voltage to the gate electrodes 131. Therefore, the photodetector 12 according to the second modification example makes it possible to control the ability to suppress the occurrence of noise. Further, the photodetector 12 according to the second modification example makes it possible to more flexibly change the regions in which the gate electrodes 131 are to be provided.

Third Modification Example

Figure 7:
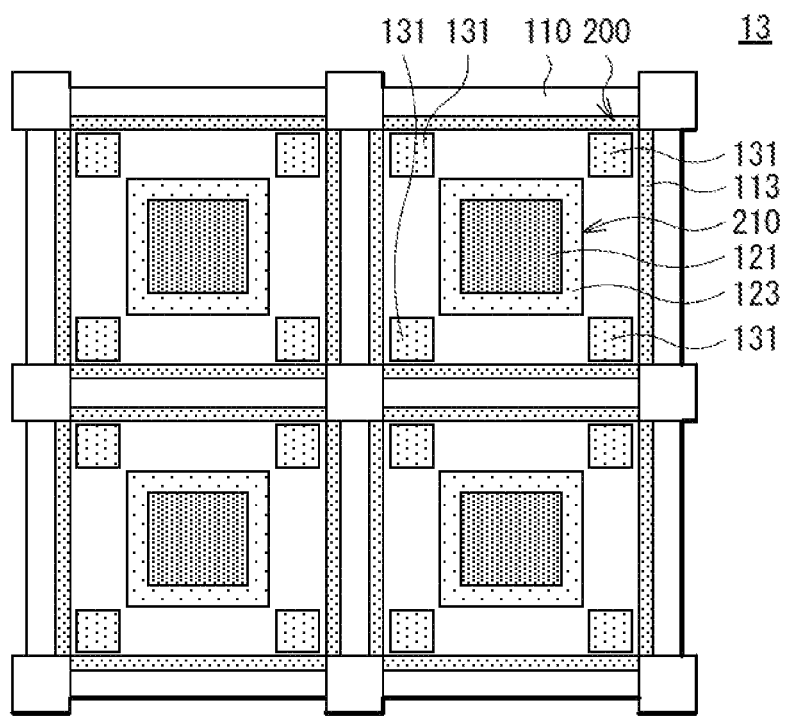
FIG. 7 is a plan diagram illustrating an example of a plan configuration of a photodetector according to a third modification example.

Next, with reference to FIG. 7, description is given of a configuration example of a photodetector according to a third modification example. FIG. 7 is a plan diagram illustrating an example of a plan configuration of the photodetector 13 according to the third modification example.

As illustrated in FIG. 7, the photodetector 13 according to the third modification example is different from the photodetector 1 illustrated in FIGS. 1 and 2 in plan arrangement of the gate electrode 131. The other configurations of the photodetector 13 according to the third modification example are similar to those of the photodetector 1 illustrated in FIGS. 1 and 2, and descriptions thereof are therefore omitted here.

In the photodetector 13 according to the third modification example, the gate electrodes 131 are provided to be spaced from each other in regions that are each between corresponding one of vertex parts of the amplification region 210 (i.e., the N++-type region 123) provided in a rectangular shape and the hole accumulation region 113. For example, the gate electrodes 131 may be provided in respective regions in the upper right, upper left, lower right, and lower left of the amplification region 210, in the shape of rectangles spaced from each other.

Thus, owing to the provision of the gate electrodes 131 in the above-described regions, the photodetector 13 according to the third modification example makes it possible to improve controllability of the potential gradient created upon application of the negative bias voltage to the gate electrodes 131. Therefore, the photodetector 13 according to the third modification example makes it possible to control the ability to suppress the occurrence of noise. Further, the photodetector 13 according to the third modification example makes it possible to more flexibly change the regions in which the gate electrodes 131 are to be provided.

Fourth Modification Example

Figure 8:
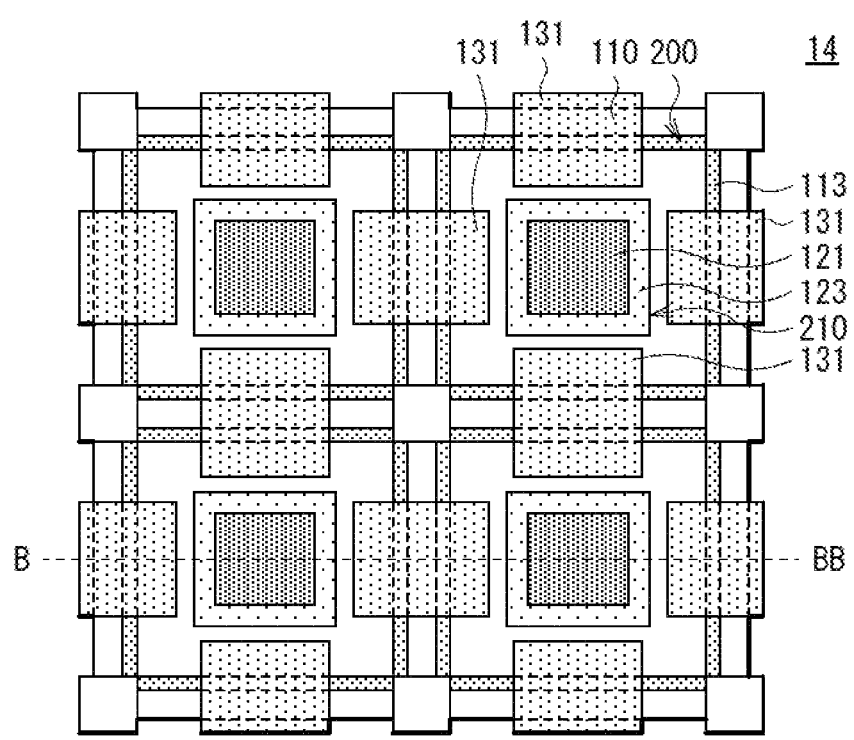
FIG. 8 is a plan diagram illustrating an example of a plan configuration of a photodetector according to a fourth modification example.
Figure 9:
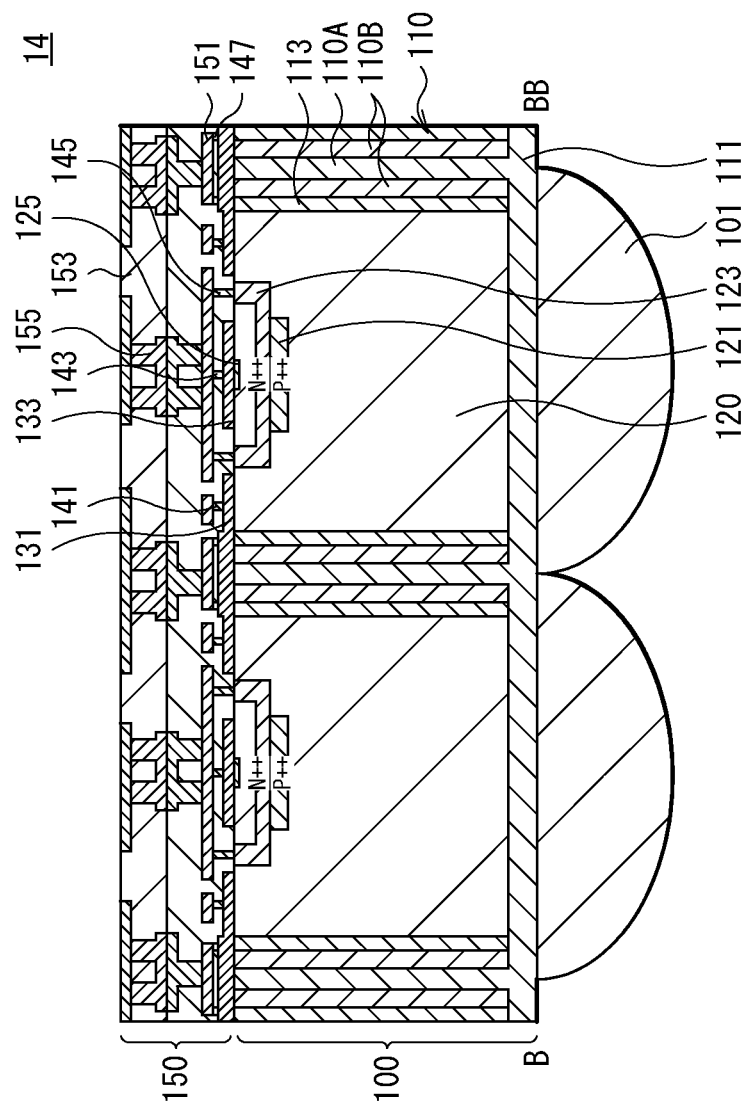
FIG. 9 is a vertical cross-sectional diagram illustrating an example of a cross-sectional configuration of the photodetector according to the fourth modification example.

Next, with reference to FIGS. 8 and 9, description is given of a configuration example of a photodetector according to a fourth modification example. FIG. 8 is a plan diagram illustrating an example of a plan configuration of the photodetector 14 according to the fourth modification example, and FIG. 9 is a vertical cross-sectional diagram illustrating an example of a cross-sectional configuration of the photodetector 14 according to the fourth modification example. The cross-sectional configuration of the photodetector 14 illustrated in FIG. 9 corresponds to a cross-sectional configuration taken along a cutting line B-BB in the plan configuration of the photodetector 14 illustrated in FIG. 8.

As illustrated in FIGS. 8 and 9, the photodetector 14 according to the fourth modification example is different from the photodetector 1 illustrated in FIGS. 1 and 2 in plan arrangement of the gate electrode 131. The other configurations of the photodetector 14 according to the fourth modification example are similar to those of the photodetector 1 illustrated in FIGS. 1 and 2, and descriptions thereof are therefore omitted here.

In the photodetector 14 according to the fourth modification example, the gate electrodes 131 are provided to be spaced from each other in regions that are each between corresponding one of the side parts of the amplification region 210 (i.e., the N++-type region 123) provided in a rectangular shape and corresponding one of the side parts of the amplification region 210 in adjacent one of the pixel regions 200. In other words, the gate electrodes 131 are each provided across the separation region 110 to be continuous with another one of the gate electrodes 131 in adjacent one of the pixel regions 200. For example, the gate electrodes 131 may extend across the separation region 110 and be provided on four respective sides above, below, to the left, and to the right of the amplification region 210, in the shape of rectangles each extending to adjacent one of the pixel regions 200.

As illustrated in FIG. 9, the gate electrodes 131 are each not only provided on the well layer 120 but also provided to extend onto the hole accumulation region 113 and the separation region 110, and therefore the gate electrodes 131 are each provided also on the metal layer 110A in the separation region 110. In such a case, in order to secure insulation between the gate electrode 131 and the metal layer 110A, the gate insulating film (not illustrated) provided on the separation region 110 may be provided into a thickness greater than that of the gate insulating film (not illustrated) provided on the well layer 120 and the hole accumulation region 113.

Thus, owing to the provision of the gate electrodes 131 in the above-described regions, the photodetector 14 according to the fourth modification example makes it possible to improve controllability of the potential gradient created upon application of the negative bias voltage to the gate electrodes 131. Therefore, the photodetector 14 according to the fourth modification example makes it possible to control the ability to suppress the occurrence of noise. Further, because the gate electrodes 131 are each provided continuously across adjacent pixel regions 200, the photodetector 14 according to the fourth modification example makes it possible to reduce the number of the contacts 141 that control the potential of the gate electrodes 131.

2. Application Examples

Example of Application to Depth Sensor

The photodetector 1 according to one embodiment of the present disclosure is applicable to an apparatus that measures a distance, for example.

For example, a ToF (Time of Flight)-type sensor is a sensor that measures a distance to a target by measuring a time for light emitted by itself to be reflected back from the target.

Specifically, in the ToF-type sensor, first, light (a light transmission pulse) is emitted from a light pulse transmitter on a basis of a supplied trigger pulse. The emitted light transmission pulse is reflected off the target, and reflected light (a light reception pulse) is received by a light pulse receiver. At this time, a difference between a time at which the light transmission pulse is emitted and a time at which the light reception pulse is received corresponds to a time corresponding to the distance to the target, that is, an optical time of flight (TOF). Thus, the ToF-type sensor is able to derive the distance to the target by deriving the optical time of flight. The photodetector 1 according to the present embodiment is usable as the light pulse receiver, for example.

Specifically, in the ToF sensor, the trigger pulse is supplied to the light pulse transmitter and also to a flip-flop circuit. By being supplied with the trigger pulse, the light pulse transmitter emits a short-time light pulse to the target. Further, the flip-flop circuit is reset by being supplied with the trigger pulse. The light pulse receiver generates, upon receiving reflected light of the emitted light pulse, an electric pulse on the basis of the reflected light received. The generated electric pulse is supplied to the flip-flop circuit to thereby reset the flip-flop circuit. The flip-flop circuit thereby generates a gate signal having a pulse width corresponding to the optical time of flight TOF. Therefore, by counting the generated gate signal by using a clock signal or the like, the ToF-type sensor is able to calculate the optical time of flight TOF and to generate information of distance to the target.

Example of Application to Mobile Body

The technology according to the present disclosure (present technology) is applicable to various products. For example, the technology according to the present disclosure may be implemented as a device to be mounted on any type of mobile body such as a vehicle, an electric vehicle, a hybrid electric vehicle, a motorcycle, a bicycle, a personal mobility, an airplane, a drone, a vessel, or a robot.

Figure 10:
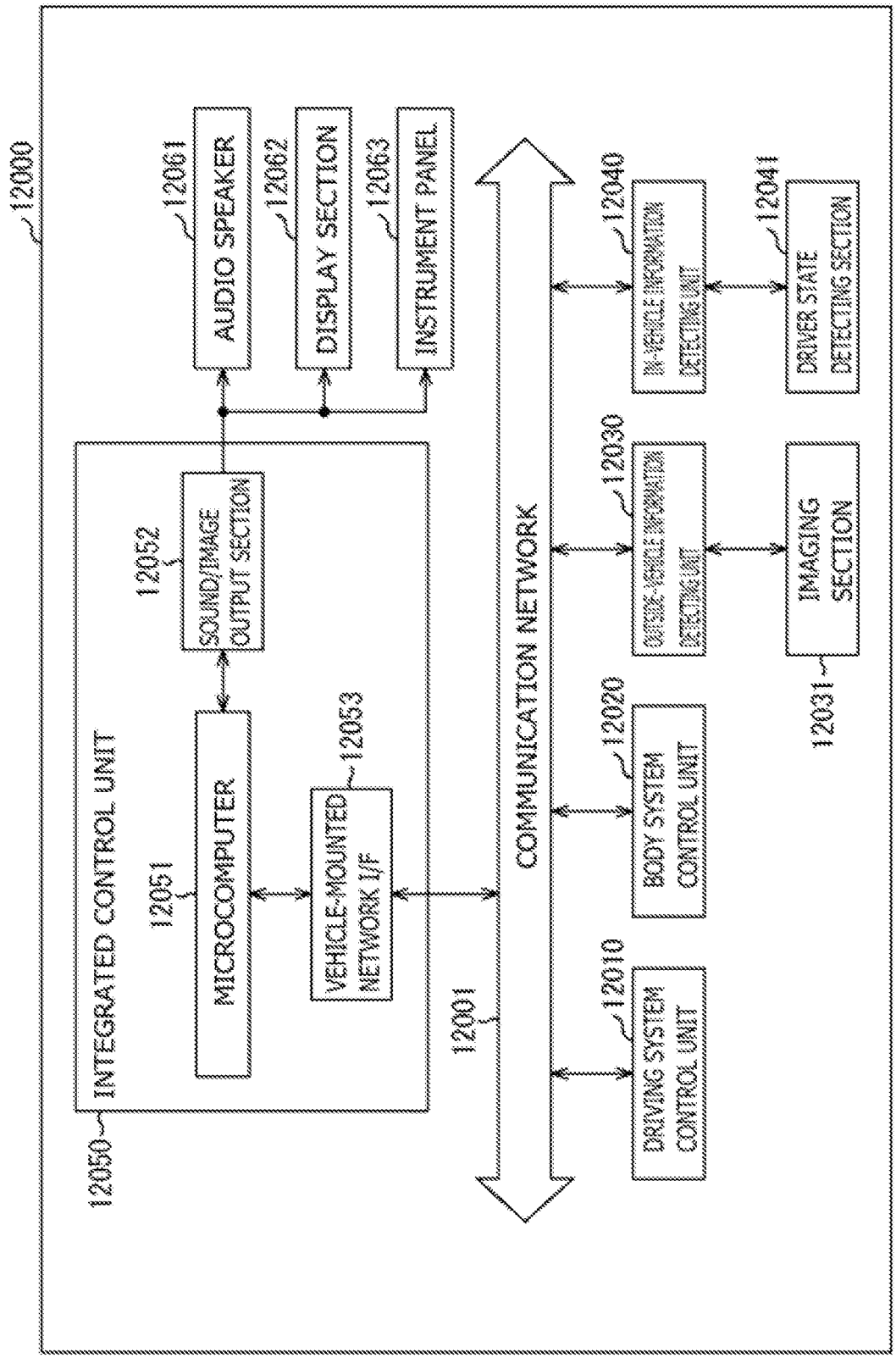
FIG. 10 is a block diagram depicting an example of schematic configuration of a vehicle control system.

FIG. 10 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 10, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 10, an audio speaker 12061, a display section 12062, and an instrument panel 12063 are illustrated as the output device. The display section 12062 may, for example, include at least one of an on-board display and a head-up display.

Figure 11:
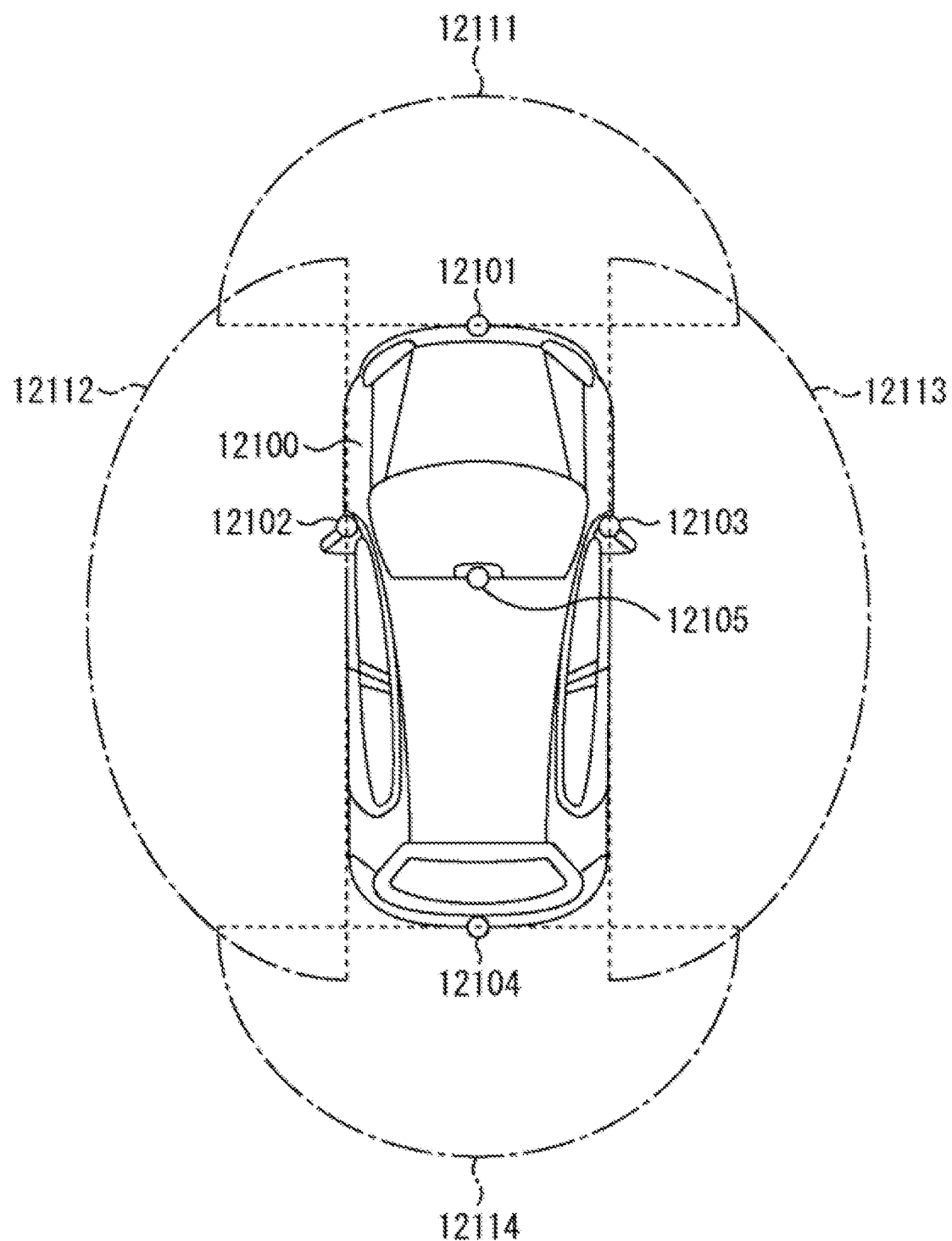
FIG. 11 is a diagram of assistance in explaining an example of installation positions of an outside-vehicle information detecting section and an imaging section.

FIG. 11 is a diagram depicting an example of the installation position of the imaging section 12031.

In FIG. 11, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 11 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

One example of the vehicle control system to which the technology according to the present disclosure is applicable has been described above. The technology according to the present disclosure is applicable to the imaging section 12031 or the like out of the configuration described above. The photodetector 1 according to the present embodiment is able to output distance measurement information with less noise; therefore, application thereof to the configuration described above makes it possible to improve accuracy of vehicle control.

Example of Application to Endoscopic Surgery System

The technology according to the present disclosure (present technology) may be applied to an endoscopic surgery system, for example.

Figure 12:
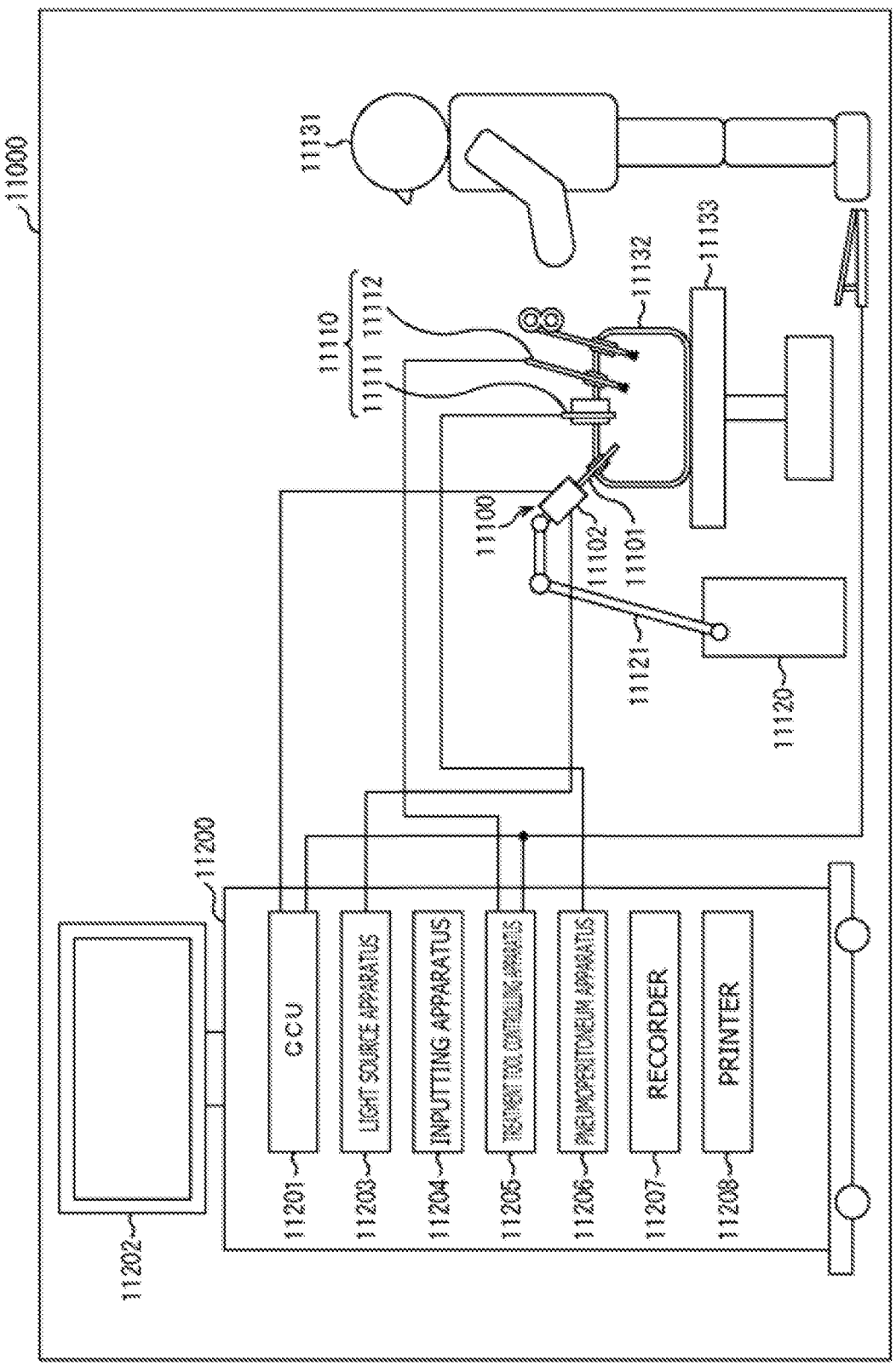
FIG. 12 is a view depicting an example of a schematic configuration of an endoscopic surgery system.

FIG. 12 is a view depicting an example of a schematic configuration of an endoscopic surgery system to which the technology according to an embodiment of the present disclosure (present technology) can be applied.

In FIG. 12, a state is illustrated in which a surgeon (medical doctor) 11131 is using an endoscopic surgery system 11000 to perform surgery for a patient 11132 on a patient bed 11133. As depicted, the endoscopic surgery system 11000 includes an endoscope 11100, other surgical tools 11110 such as a pneumoperitoneum tube 11111 and an energy treatment tool 11112, a supporting arm apparatus 11120 which supports the endoscope 11100 thereon, and a cart 11200 on which various apparatus for endoscopic surgery are mounted.

The endoscope 11100 includes a lens barrel 11101 having a region of a predetermined length from a distal end thereof to be inserted into a body lumen of the patient 11132, and a camera head 11102 connected to a proximal end of the lens barrel 11101. In the example depicted, the endoscope 11100 is depicted which includes as a hard mirror having the lens barrel 11101 of the hard type. However, the endoscope 11100 may otherwise be included as a soft mirror having the lens barrel 11101 of the soft type.

The lens barrel 11101 has, at a distal end thereof, an opening in which an objective lens is fitted. A light source apparatus 11203 is connected to the endoscope 11100 such that light generated by the light source apparatus 11203 is introduced to a distal end of the lens barrel 11101 by a light guide extending in the inside of the lens barrel 11101 and is irradiated toward an observation target in a body lumen of the patient 11132 through the objective lens. It is to be noted that the endoscope 11100 may be a direct view mirror or may be a perspective view mirror or a side view mirror.

An optical system and an image pickup element are provided in the inside of the camera head 11102 such that reflected light (observation light) from the observation target is condensed on the image pickup element by the optical system. The observation light is photo-electrically converted by the image pickup element to generate an electric signal corresponding to the observation light, namely, an image signal corresponding to an observation image. The image signal is transmitted as RAW data to a CCU 11201.

The CCU 11201 includes a central processing unit (CPU), a graphics processing unit (GPU) or the like and integrally controls operation of the endoscope 11100 and a display apparatus 11202. Further, the CCU 11201 receives an image signal from the camera head 11102 and performs, for the image signal, various image processes for displaying an image based on the image signal such as, for example, a development process (demosaic process).

The display apparatus 11202 displays thereon an image based on an image signal, for which the image processes have been performed by the CCU 11201, under the control of the CCU 11201.

The light source apparatus 11203 includes a light source such as, for example, a light emitting diode (LED) and supplies irradiation light upon imaging of a surgical region to the endoscope 11100.

An inputting apparatus 11204 is an input interface for the endoscopic surgery system 11000. A user can perform inputting of various kinds of information or instruction inputting to the endoscopic surgery system 11000 through the inputting apparatus 11204. For example, the user would input an instruction or a like to change an image pickup condition (type of irradiation light, magnification, focal distance or the like) by the endoscope 11100.

A treatment tool controlling apparatus 11205 controls driving of the energy treatment tool 11112 for cautery or incision of a tissue, sealing of a blood vessel or the like. A pneumoperitoneum apparatus 11206 feeds gas into a body lumen of the patient 11132 through the pneumoperitoneum tube 11111 to inflate the body lumen in order to secure the field of view of the endoscope 11100 and secure the working space for the surgeon. A recorder 11207 is an apparatus capable of recording various kinds of information relating to surgery. A printer 11208 is an apparatus capable of printing various kinds of information relating to surgery in various forms such as a text, an image or a graph.

It is to be noted that the light source apparatus 11203 which supplies irradiation light when a surgical region is to be imaged to the endoscope 11100 may include a white light source which includes, for example, an LED, a laser light source or a combination of them. Where a white light source includes a combination of red, green, and blue (RGB) laser light sources, since the output intensity and the output timing can be controlled with a high degree of accuracy for each color (each wavelength), adjustment of the white balance of a picked up image can be performed by the light source apparatus 11203. Further, in this case, if laser beams from the respective RGB laser light sources are irradiated time-divisionally on an observation target and driving of the image pickup elements of the camera head 11102 are controlled in synchronism with the irradiation timings. Then images individually corresponding to the R, G and B colors can be also picked up time-divisionally. According to this method, a color image can be obtained even if color filters are not provided for the image pickup element.

Further, the light source apparatus 11203 may be controlled such that the intensity of light to be outputted is changed for each predetermined time. By controlling driving of the image pickup element of the camera head 11102 in synchronism with the timing of the change of the intensity of light to acquire images time-divisionally and synthesizing the images, an image of a high dynamic range free from underexposed blocked up shadows and overexposed highlights can be created.

Further, the light source apparatus 11203 may be configured to supply light of a predetermined wavelength band ready for special light observation. In special light observation, for example, by utilizing the wavelength dependency of absorption of light in a body tissue to irradiate light of a narrow band in comparison with irradiation light upon ordinary observation (namely, white light), narrow band observation (narrow band imaging) of imaging a predetermined tissue such as a blood vessel of a superficial portion of the mucous membrane or the like in a high contrast is performed. Alternatively, in special light observation, fluorescent observation for obtaining an image from fluorescent light generated by irradiation of excitation light may be performed. In fluorescent observation, it is possible to perform observation of fluorescent light from a body tissue by irradiating excitation light on the body tissue (autofluorescence observation) or to obtain a fluorescent light image by locally injecting a reagent such as indocyanine green (ICG) into a body tissue and irradiating excitation light corresponding to a fluorescent light wavelength of the reagent upon the body tissue. The light source apparatus 11203 can be configured to supply such narrow-band light and/or excitation light suitable for special light observation as described above.

Figure 13:
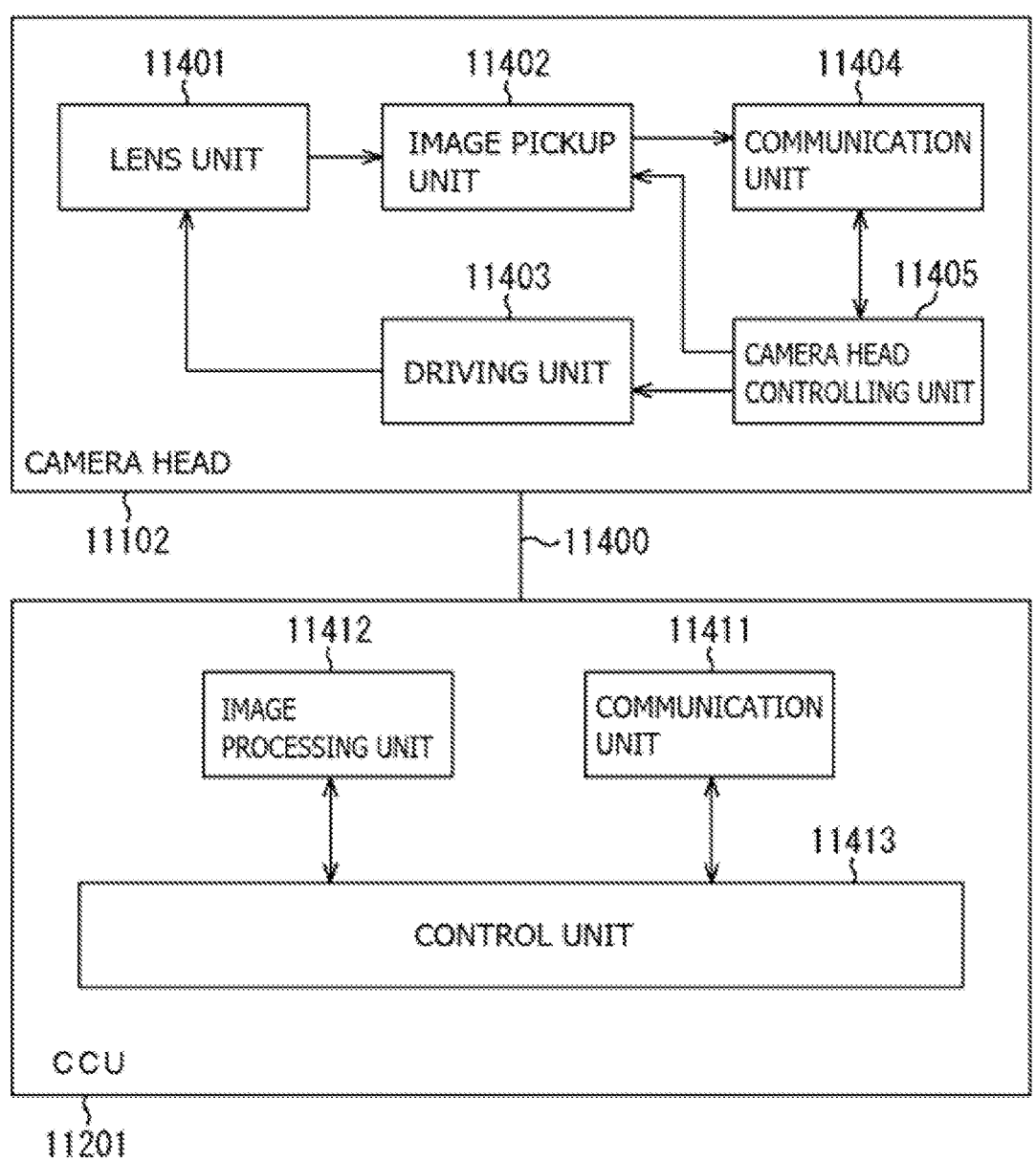
FIG. 13 is a block diagram depicting an example of a functional configuration of a camera head and a camera control unit (CCU).

FIG. 13 is a block diagram depicting an example of a functional configuration of the camera head 11102 and the CCU 11201 depicted in FIG. 12.

The camera head 11102 includes a lens unit 11401, an image pickup unit 11402, a driving unit 11403, a communication unit 11404 and a camera head controlling unit 11405. The CCU 11201 includes a communication unit 11411, an image processing unit 11412 and a control unit 11413. The camera head 11102 and the CCU 11201 are connected for communication to each other by a transmission cable 11400.

The lens unit 11401 is an optical system, provided at a connecting location to the lens barrel 11101. Observation light taken in from a distal end of the lens barrel 11101 is guided to the camera head 11102 and introduced into the lens unit 11401. The lens unit 11401 includes a combination of a plurality of lenses including a zoom lens and a focusing lens.

The number of image pickup elements which is included by the image pickup unit 11402 may be one (single-plate type) or a plural number (multi-plate type). Where the image pickup unit 11402 is configured as that of the multi-plate type, for example, image signals corresponding to respective R, G and B are generated by the image pickup elements, and the image signals may be synthesized to obtain a color image. The image pickup unit 11402 may also be configured so as to have a pair of image pickup elements for acquiring respective image signals for the right eye and the left eye ready for three dimensional (3D) display. If 3D display is performed, then the depth of a living body tissue in a surgical region can be comprehended more accurately by the surgeon 11131. It is to be noted that, where the image pickup unit 11402 is configured as that of stereoscopic type, a plurality of systems of lens units 11401 are provided corresponding to the individual image pickup elements.

Further, the image pickup unit 11402 may not necessarily be provided on the camera head 11102. For example, the image pickup unit 11402 may be provided immediately behind the objective lens in the inside of the lens barrel 11101.

The driving unit 11403 includes an actuator and moves the zoom lens and the focusing lens of the lens unit 11401 by a predetermined distance along an optical axis under the control of the camera head controlling unit 11405. Consequently, the magnification and the focal point of a picked up image by the image pickup unit 11402 can be adjusted suitably.

The communication unit 11404 includes a communication apparatus for transmitting and receiving various kinds of information to and from the CCU 11201. The communication unit 11404 transmits an image signal acquired from the image pickup unit 11402 as RAW data to the CCU 11201 through the transmission cable 11400.

In addition, the communication unit 11404 receives a control signal for controlling driving of the camera head 11102 from the CCU 11201 and supplies the control signal to the camera head controlling unit 11405. The control signal includes information relating to image pickup conditions such as, for example, information that a frame rate of a picked up image is designated, information that an exposure value upon image picking up is designated and/or information that a magnification and a focal point of a picked up image are designated.

It is to be noted that the image pickup conditions such as the frame rate, exposure value, magnification or focal point may be designated by the user or may be set automatically by the control unit 11413 of the CCU 11201 on the basis of an acquired image signal. In the latter case, an auto exposure (AE) function, an auto focus (AF) function and an auto white balance (AWB) function are incorporated in the endoscope 11100.

The camera head controlling unit 11405 controls driving of the camera head 11102 on the basis of a control signal from the CCU 11201 received through the communication unit 11404.

The communication unit 11411 includes a communication apparatus for transmitting and receiving various kinds of information to and from the camera head 11102. The communication unit 11411 receives an image signal transmitted thereto from the camera head 11102 through the transmission cable 11400.

Further, the communication unit 11411 transmits a control signal for controlling driving of the camera head 11102 to the camera head 11102. The image signal and the control signal can be transmitted by electrical communication, optical communication or the like.

The image processing unit 11412 performs various image processes for an image signal in the form of RAW data transmitted thereto from the camera head 11102.

The control unit 11413 performs various kinds of control relating to image picking up of a surgical region or the like by the endoscope 11100 and display of a picked up image obtained by image picking up of the surgical region or the like. For example, the control unit 11413 creates a control signal for controlling driving of the camera head 11102.

Further, the control unit 11413 controls, on the basis of an image signal for which image processes have been performed by the image processing unit 11412, the display apparatus 11202 to display a picked up image in which the surgical region or the like is imaged. Thereupon, the control unit 11413 may recognize various objects in the picked up image using various image recognition technologies. For example, the control unit 11413 can recognize a surgical tool such as forceps, a particular living body region, bleeding, mist when the energy treatment tool 11112 is used and so forth by detecting the shape, color and so forth of edges of objects included in a picked up image. The control unit 11413 may cause, when it controls the display apparatus 11202 to display a picked up image, various kinds of surgery supporting information to be displayed in an overlapping manner with an image of the surgical region using a result of the recognition. Where surgery supporting information is displayed in an overlapping manner and presented to the surgeon 11131, the burden on the surgeon 11131 can be reduced and the surgeon 11131 can proceed with the surgery with certainty.

The transmission cable 11400 which connects the camera head 11102 and the CCU 11201 to each other is an electric signal cable ready for communication of an electric signal, an optical fiber ready for optical communication or a composite cable ready for both of electrical and optical communications.

Here, while, in the example depicted, communication is performed by wired communication using the transmission cable 11400, the communication between the camera head 11102 and the CCU 11201 may be performed by wireless communication.

One example of the endoscopic surgery system to which the technology according to the present disclosure is applicable has been described above. The technology according to the present disclosure is applicable to, for example, the endoscope 11100, or to the image pickup unit 11402 of the camera head 11102 out of the configuration described above. The photodetector 1 according to the present embodiment is able to output distance measurement information with less noise; therefore, application thereof to the configuration described above makes it possible to improve accuracy of operation of the surgical tools 11110 or the energy treatment tool 11112 by the surgeon 11131.

It is to be noted that while the description has been given here of the endoscopic surgery system as one example, the technology according to the present disclosure may also be applied to, for example, a micrographic surgery system and the like.

The technology according to the present disclosure has been described above with reference to the embodiments and the modification examples. However, the technology according to the present disclosure is not limited to the embodiments and the like described above, and may be modified in a variety of ways.

Furthermore, not all of the configurations and operations described in each of the embodiments are indispensable as the configurations and operations of the present disclosure. For example, among the components of each of the embodiments, any component that is not recited in an independent claim which represents the most generic concept of the present disclosure is to be understood as an optional component.

Terms used throughout this specification and the appended claims should be construed as "non-limiting" terms. For example, the term "including" or "included" should be construed as "not limited to what is described as being included". The term "having" should be construed as "not limited to what is described as being had".

The terms used herein are used merely for the convenience of description and include terms that are not used to limit the configuration and the operation. For example, the terms such as "right", "left", "upper", and "lower" only indicate directions in the drawings being referred to. In addition, the terms "inside" and "outside" only indicate a direction toward the center of a component of interest and a direction away from the center of a component of interest, respectively. The same applies to terms similar to these and to terms with the similar purpose.

It is to be noted that the technology according to the present disclosure may have the following configurations. The technology according to the present disclosure having the following configurations allows entering light passing through the semiconductor layer and making an entry into the multilayer wiring layer to be reflected by the gate electrode and thereby returned to the semiconductor layer side. Therefore, the photodetector according to one embodiment of the present disclosure allows for an increase in the amount of carriers to be generated by the entering light in the semiconductor layer, thus making it possible to further improve the detection sensitivity to light. Effects attained by the technology according to the present disclosure are not necessarily limited to the effects described herein, but may include any of the effects described in the present disclosure.

(1)
   A photodetector including:
      an amplification region that includes a PN junction provided in a depth direction in a semiconductor layer and that is to be electrically coupled to a cathode;
      a separation region that defines a pixel region including the amplification region;
      a hole accumulation region that is provided along a side surface of the separation region and that is to be electrically coupled to an anode; and
      a gate electrode provided in a region between the amplification region and the hole accumulation region and stacked over the semiconductor layer with a gate insulating film interposed therebetween.

(2)
   The photodetector according to (1), in which the amplification region and the pixel region each have a rectangular shape.

(3)
   The photodetector according to (1) or (2), in which the gate electrode is provided in a region surrounding the amplification region.

(4)
   The photodetector according to (3), in which the gate electrode is provided continuously in the region between the amplification region and the hole accumulation region.

(5)
   The photodetector according to (2), in which a plurality of the gate electrodes is provided in a respective plurality of regions spaced from each other.

(6)
   The photodetector according to (5), in which the gate electrodes are provided in the respective regions that are each between corresponding one of side parts of the rectangular shape of the amplification region and the hole accumulation region.

(7)
   The photodetector according to (5), in which the gate electrodes are provided in the respective regions that are each between corresponding one of vertex parts of the rectangular shape of the amplification region and the hole accumulation region.

(8)

The photodetector according to any one of (5) to (7), in which the gate electrodes are each provided across the separation region to be continuous with another one of the gate electrodes provided in adjacent one of a plurality of the pixel regions.
(9)
The photodetector according to (8), in which the gate insulating film provided in the separation region has a film thickness greater than a film thickness of the gate insulating film provided in the pixel region.
(10)
The photodetector according to any one of (1) to (9), in which the gate electrode is provided to allow a negative bias voltage to be applied thereto.
(11)
The photodetector according to (10), in which the gate electrode is provided to be embedded inside the semiconductor layer.
(12)
The photodetector according to any one of (1) to (11), in which an electrical conductivity type of the hole accumulation region is a P type.
(13)
The photodetector according to any one of (1) to (12), in which
 a contact that electrically couples to the amplification region and the cathode is provided at an end of the amplification region, and
 a P-type region is provided on a front surface of the semiconductor layer in a middle part of the amplification region.
(14)
The photodetector according to any one of (1) to (13), in which the PN junction is provided by joining an N++-type region onto a P++-type region provided inside the semiconductor layer.

This application claims the benefit of Japanese Priority Patent Application JP2019-233854 filed with the Japan Patent Office on Dec. 25, 2019, the entire contents of which are incorporated herein by reference.

It should be understood by those skilled in the art that various modifications, combinations, sub-combinations, and alterations may occur depending on design requirements and other factors insofar as they are within the scope of the appended claims or the equivalents thereof.

What is claimed is:
1. A photodetector, comprising:
 an amplification region that includes a PN junction provided in a depth direction in a semiconductor layer and that is to be electrically coupled to a cathode;
 a separation region that defines a pixel region including the amplification region;
 a hole accumulation region that is provided along a side surface of the separation region and that is to be electrically coupled to an anode; and
 a gate electrode provided in a region between the amplification region and the hole accumulation region and stacked over the semiconductor layer with a gate insulating film interposed therebetween.

2. The photodetector according to claim 1, wherein the amplification region and the pixel region each have a rectangular shape.

3. The photodetector according to claim 1, wherein the gate electrode is provided in a region surrounding the amplification region.

4. The photodetector according to claim 3, wherein the gate electrode is provided continuously in the region between the amplification region and the hole accumulation region.

5. The photodetector according to claim 2, wherein a plurality of the gate electrodes is provided in a respective plurality of regions spaced from each other.

6. The photodetector according to claim 5, wherein the gate electrodes are provided in the respective regions that are each between corresponding one of side parts of the rectangular shape of the amplification region and the hole accumulation region.

7. The photodetector according to claim 5, wherein the gate electrodes are provided in the respective regions that are each between corresponding one of vertex parts of the rectangular shape of the amplification region and the hole accumulation region.

8. The photodetector according to claim 5, wherein the gate electrodes are each provided across the separation region to be continuous with another one of the gate electrodes provided in adjacent one of a plurality of the pixel regions.

9. The photodetector according to claim 8, wherein the gate insulating film provided in the separation region has a film thickness greater than a film thickness of the gate insulating film provided in the pixel region.

10. The photodetector according to claim 1, wherein the gate electrode is provided to allow a negative bias voltage to be applied thereto.

11. The photodetector according to claim 10, wherein the gate electrode is provided to be embedded inside the semiconductor layer.

12. The photodetector according to claim 1, wherein an electrical conductivity type of the hole accumulation region is a P type.

13. The photodetector according to claim 1, wherein
 a contact that electrically couples to the amplification region and the cathode is provided at an end of the amplification region, and
 a P-type region is provided on a front surface of the semiconductor layer in a middle part of the amplification region.

14. The photodetector according to claim 1, wherein the PN junction is provided by joining an N++-type region onto a P++-type region provided inside the semiconductor layer.

* * * * *